United States Patent
Hsu et al.

[11] Patent Number: 6,150,261
[45] Date of Patent: Nov. 21, 2000

[54] METHOD OF FABRICATING SEMICONDUCTOR DEVICE FOR PREVENTING ANTENNA EFFECT

[75] Inventors: Chen-Chung Hsu, Hsinchu Hsien; Yih-Jau Chang, Hsinchu, both of Taiwan

[73] Assignee: United Microelectronics Corp., Taiwan

[21] Appl. No.: 09/318,235

[22] Filed: May 25, 1999

[51] Int. Cl.[7] .............................. H01L 21/4763
[52] U.S. Cl. .................. 438/640; 438/637; 438/627; 438/643; 438/648; 438/685; 438/672
[58] Field of Search .................. 438/640, 618, 438/622–629, 637–644, 648, 650, 656, 667–668, 672–673, 675, 685–688, 713

[56] References Cited

U.S. PATENT DOCUMENTS

| | | | |
|---|---|---|---|
| 5,312,775 | 5/1994 | Fujii et al. | 438/625 |
| 5,593,919 | 1/1997 | Lee et al. | 438/626 |
| 5,763,954 | 6/1998 | Hyakutake | 257/774 |
| 5,821,168 | 10/1998 | Jain | 438/692 |
| 5,913,141 | 6/1999 | Bothra | 438/625 |
| 5,960,310 | 9/1999 | Jeong | 438/622 |

*Primary Examiner*—Charles Bowers
*Assistant Examiner*—Thanh Nguyen
*Attorney, Agent, or Firm*—Martine Penilla & Kim, LLP

[57] ABSTRACT

A method of fabricating a semiconductor device for preventing an antenna effect. In the invention, there is no additional mask layer or specific process performed. Thus, the fabrication cost does not increase. In addition, extra electrons are released through a path formed in the invention during the plasma-etching step. An antenna effect thus does not occur. The reliability of the semiconductor device is increased.

11 Claims, 6 Drawing Sheets

METHOD OF FABRICATING SEMICONDUCTOR DEVICE FOR PREVENTING ANTENNA EFFECT

BACKGROUND OF THE INVENTION

1. Field of the Invention

The present invention relates to a semiconductor fabrication method. More particularly, the present invention relates to a method of fabricating a semiconductor device for preventing an antenna effect.

2. Description of the Related Art

The antenna effect is one of the most common factors related to the stability of a device occurred in a plasma process. The antenna effect arises from a plasma-etching process. During the plasma-etching process, electrons and positive ions ($e^-$ and $p^+$) decompose from the surface of a substrate by an ionization reaction. These charged particles move outward through conductive wires having lowest resistance. This causes the antenna effect.

In general, the strength of the antenna effect is proportional to an antenna ratio of area ($A_A$) or an antenna ratio of perimeter ($A_P$). The higher the antenna ratio is, the stronger the antenna effect is.

Antenna ratio of area $A_A$ is defined as:

$$A_A = M_A/G_A$$

where $M_A$ is the area of an interconnect metallic layer and $G_A$ is the area of a gate.

Antenna ratio of perimeter $A_P$ is defined as:

$$A_P = M_P/G_P$$

where $M_P$ is the perimeter of an interconnect metallic layer and $G_P$ is the perimeter of a gate.

According to the above formulas, as the $M_A$ or $M_P$ decreases, the antenna effect is reduced. As the $G_A$ or $G_P$ increases, the antenna ratio is decreased.

For a semiconductor fabrication process at or below a deep sub-micron level, because the device is highly integrated, the antenna effect becomes especially serious. In addition, because difficulties exist in detecting the antenna effect between a multilevel interconnect metallic layer and a polysilicon gate of a highly integrated device, it is hard to ensure the reliability of the device. Therefore, effective detection and method for preventing the antenna effect are both important research subjects.

Reference is made to FIG. 1, which illustrates top view of a conventional device for preventing an antenna effect.

In FIG. 1, a substrate 10 comprises a transistor T1, such as a metal oxide semiconductor (MOS) transistor. A transistor gate 12 is electrically connected to the metallic layer via a polysilicon interconnection 14 on the substrate 10. The metallic layer 16 is electrically coupled with a detector 20, which detects the antenna effect, through a contact 18.

In addition, the conventional detector 20 further comprises a protection diode on the metallic layer 16. The protection diode is formed to prevent an antenna effect from occurring in the metallic layer 16 and damaging T1. However, the diode cannot effectively prevent the damage caused by charged carrier produced by positive/negative bias during the plasma process, and thus, the protection is limited.

SUMMARY OF THE INVENTION

The invention provides a method of fabricating a semiconductor device for preventing an antenna effect. An isolation structure is formed in a semiconductor substrate to define an active region next to the isolation structure. A gate comprising a polysilicon layer is formed on the isolation structure. A dielectric layer is formed over the substrate. The dielectric layer is patterned to form a first opening and a second opening. The first opening exposes a portion of the substrate in the active region, and the second opening exposes a portion of the polysilicon layer of the gate. A conductive layer is formed on the dielectric layer to fill the first opening and the second opening. A portion of the conductive layer is removed until the surface of the conductive layer is level with the surface of the dielectric layer. A patterned metallic layer exposing a portion of the dielectric layer is formed. The metallic layer comprises a first metallic layer and a second metallic layer. The first metallic layer covers a portion of the dielectric layer, and the second metallic layer covers the conductive layer and a portion of the dielectric layer. A dielectric layer is formed over the substrate. The dielectric layer is patterned to form a first opening and a second opening. The first opening exposes a portion of the first metallic layer, and the second opening exposes a portion of the second metallic layer. A glue/barrier layer and a tungsten layer are formed over the substrate. Portions of the tungsten layer and the glue/barrier layer are removed to form a tungsten plug in the first opening and a tungsten spacer on a sidewall of the second opening. A third metallic layer is formed over the substrate. A patterned photoresist layer is formed on the third metallic layer above the tungsten plug. A portion of the third metallic layer and the second metallic layer are removed with the photoresist layer and the tungsten spacer serving as masks. The photoresist layer and the spacer are removed.

The invention prevents the occurrence of an antenna effect. The reliability of the semiconductor device thus is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 3A is a schematic, top view of the structure depicted in FIG. 2C, wherein FIG. 2C is a schematic, cross-sectional view of FIG. 3A taken along line A-A';

FIG. 3B is a schematic, top view of the structure depicted in FIG. 2E, wherein FIG. 2E is a schematic, cross-sectional view of FIG. 3B taken along line B-B'; and FIG. 3C is a schematic, top view of the structure depicted in FIG. 2H, wherein FIG. 2H is a schematic, cross-sectional view of FIG. 3C taken along line C-C'.

DESCRIPTION OF THE PREFERRED EMBODIMENTS

Figure 1:
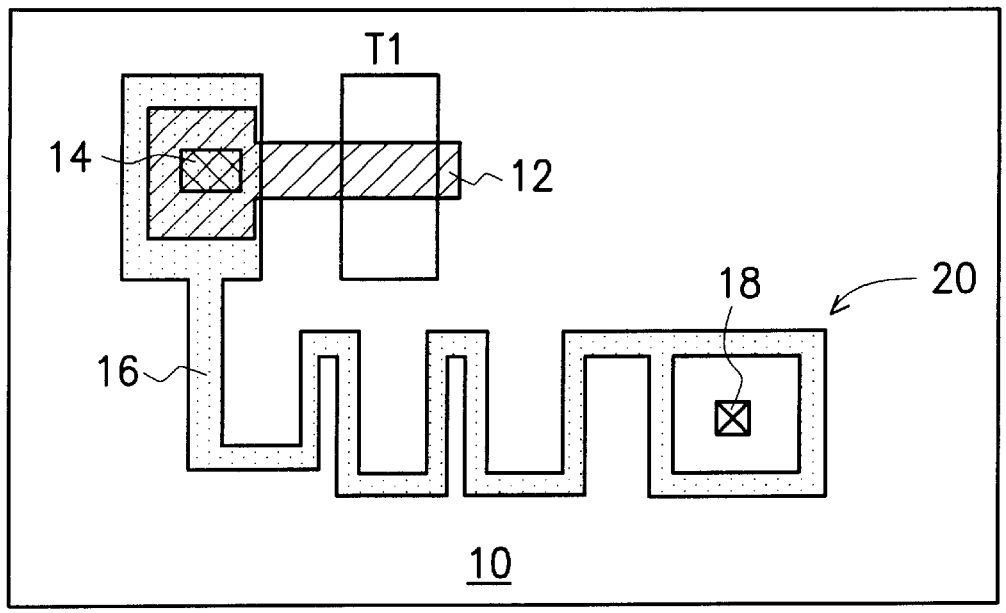
FIG. 1 is a schematic, top view of a conventional device for preventing an antenna effect.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2H are schematic, cross-sectional views showing a method of fabricating a semiconductor structure for preventing an antenna effect according to one preferred embodiment of the invention.

Figure 2A:
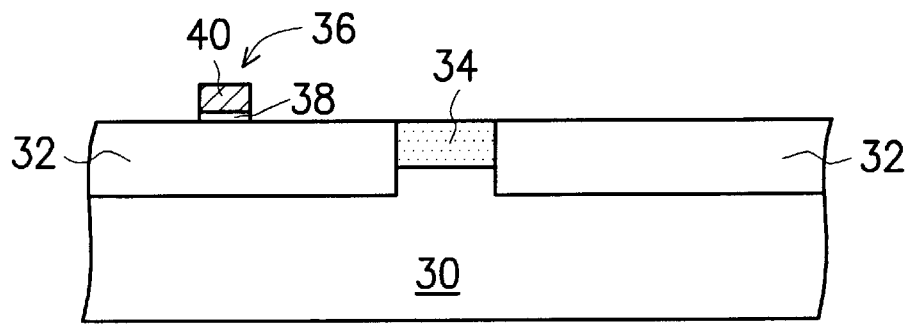
FIGS. 2A through 2H are schematic, cross-sectional views showing a method of fabricating a semiconductor structure for preventing an antenna effect according to one preferred embodiment of the invention.

In FIG. 2A, an isolation structure 32, such as a shallow trench isolation (STI) structure, is formed in the substrate 30. An active region 34 is defined next to the isolation structure 32. A gate 36 is formed on the isolation structure 32. The gate 36 comprises a gate oxide layer 38 and the polysilicon layer 40 formed in sequence over the substrate 30.

Figure 2B:
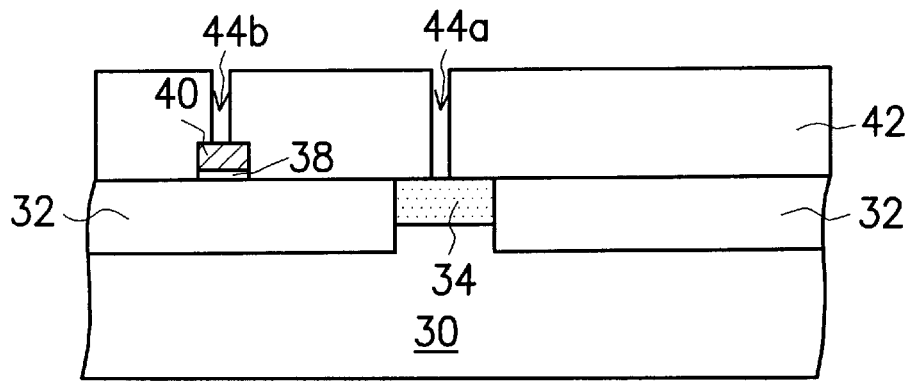

In FIG. 2B, a dielectric layer 42 is formed over the substrate 30 by, for example, chemical vapor deposition (CVD). The material of the dielectric layer 42 comprises silicon oxide ($SiO_2$). The dielectric layer 42 is patterned by, for example, a conventional photolithographic and etching process. Contact openings 44a and 44b are formed through the dielectric layer 42. The contact opening 44a exposes a portion of the substrate 30 in the active region 34. The contact opening 44b exposes a portion of the polysilicon layer 40 of the gate 36.

Figure 2C:
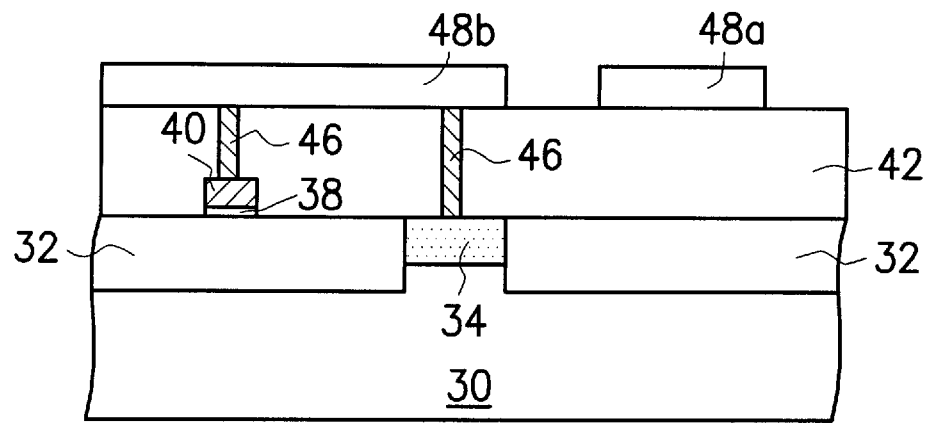
Figure 3A:
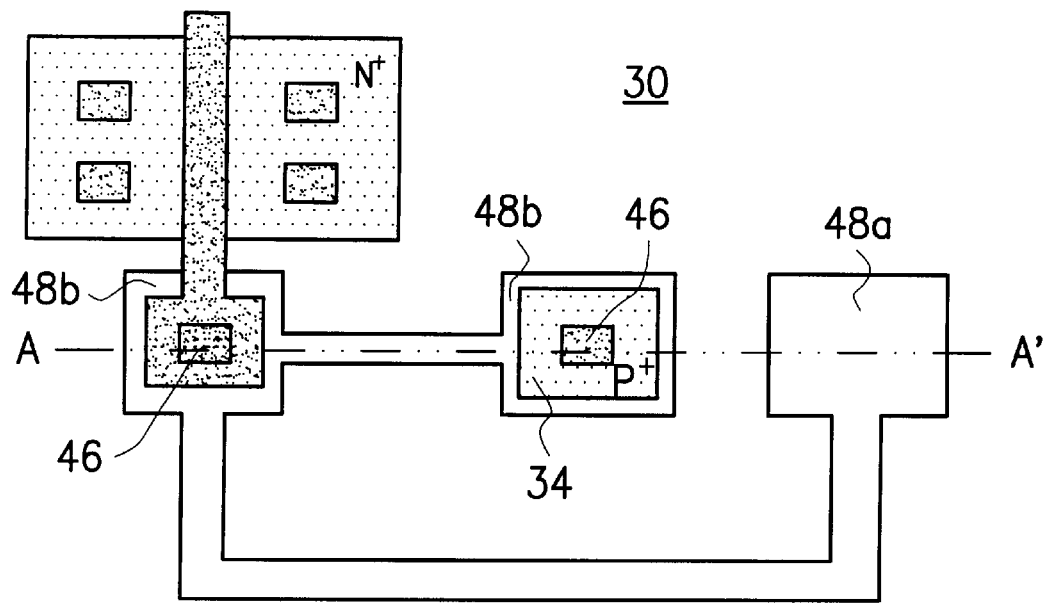

Reference is made to FIG. 2C, which is a schematic, cross-sectional view of FIG. 3A taken along line A-A'. FIG. 3A is a schematic, top view of the structure depicted in FIG. 2C. In FIG. 2C, a conductive layer is formed on the dielectric layer 42 to fill the openings 44a and 44b. The material of the conductive layer comprises tungsten and polysilicon. In order to increase the conductivity of the conductive layer, an ion implantation step can be performed on the conductive layer. An etching back step is performed to remove a portion of the conductive layer until the surface of the conductive layer is level with a top surface of the dielectric layer 42. The conductive layer remaining in the openings are denoted as a reference numeral 46. A metallic layer (not shown) is formed on the dielectric layer 42 and the conductive layer 46. The metallic layer is patterned by a plasma-etching step to form a metallic layer 48a and a metallic layer 48b. The metallic layer 48a covers a portion of the dielectric layer 42. The metallic layer 48b covers the conductive layer 46 and a portion of the dielectric layer 42. In the plasma-etching step, since the gate 36 is coupled with the substrate 30, extra electrons generated in the step can be released through the metallic layer 48b and the conductive layer 46 to the substrate 30. The metallic layer 48b, the conductive layer 46, and the substrate 30 together form a path for releasing extra electrons. Thus, an antenna effect does not occur.

Figure 2D:
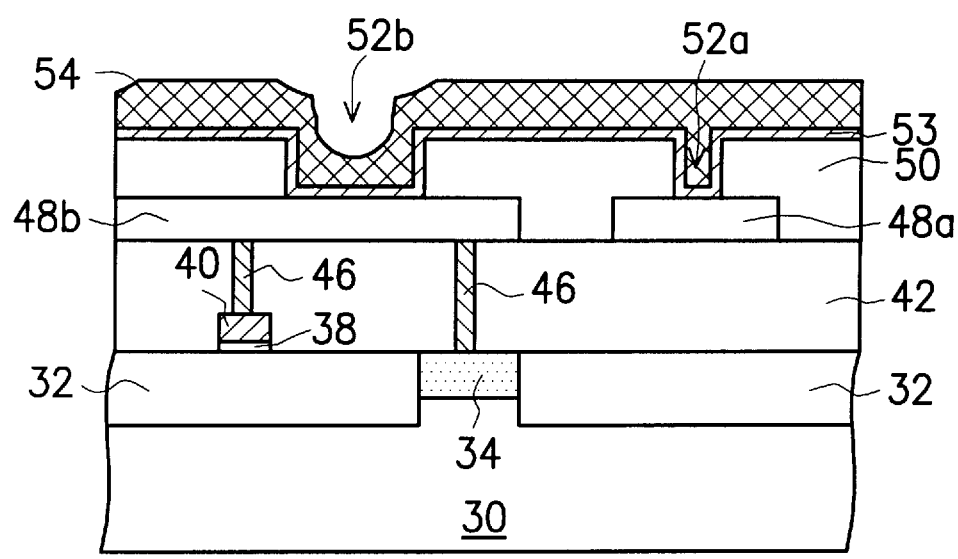

In FIG. 2D, a dielectric layer 50 is formed over the substrate 30. The dielectric layer 50 is patterned to form openings 52a and 52b. The opening 52a exposes a portion of the metallic layer 48a and the opening 52b exposes a portion of the metallic layer 48b. The opening 52b is larger than the opening 52a. In the invention, the openings 52a and 52b can be formed without obeying a minimum via design. A conformal glue/barrier layer 53 is formed over the substrate 30 by, for example, sputtering. The material of the glue/barrier layer 53 comprises titanium/titanium nitride (Ti/TiN). The glue/barrier layer 53 is formed in order to increase the adhesion ability between the dielectric layer 50 and other metallic material formed in the following step. A tungsten layer 54 is formed over the substrate 30 to fill the opening 52a and 52b and to cover the glue/barrier layer 50. Since the opening 52b is large, the tungsten layer 54 does not completely fill the opening 52b, as shown in FIG. 2D.

Figure 2E:
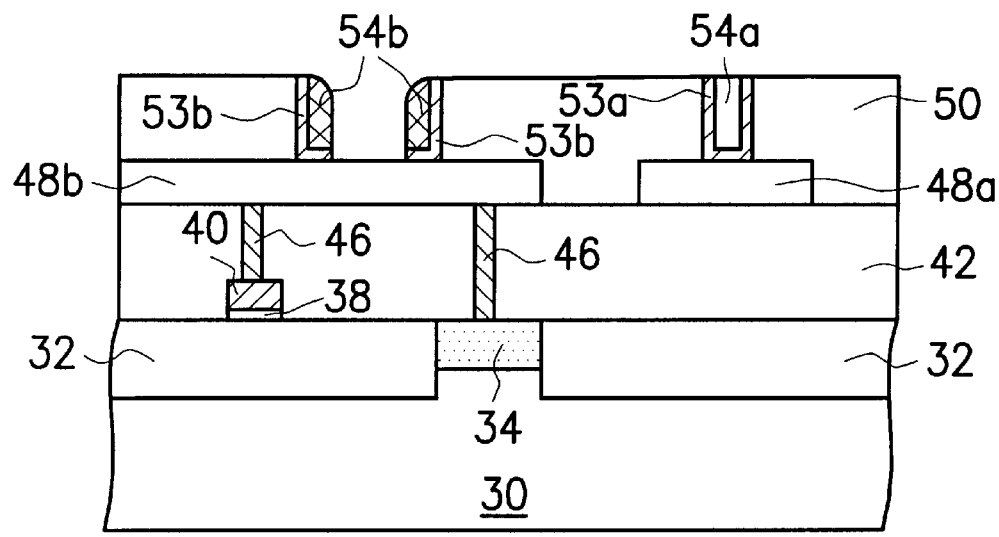
Figure 3B:
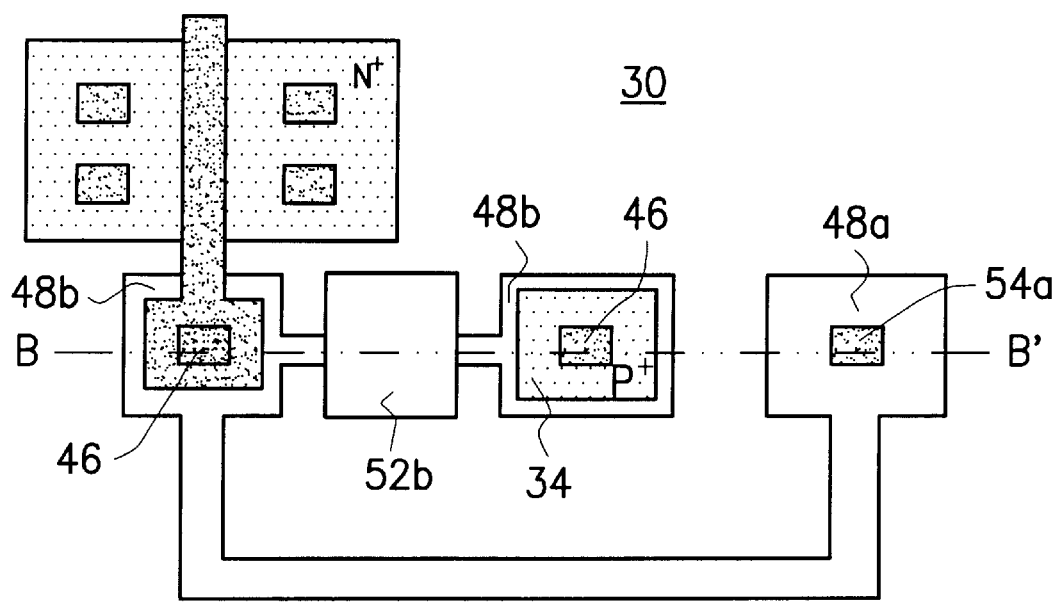

Reference is made to FIG. 2E, which is a schematic, cross-sectional view of FIG. 3B taken along line B-B'. FIG. 3B is a schematic, top view of the structure depicted in FIG. 2E. In FIG. 2E, a tungsten etching back process is performed on the tungsten layer 54. A tungsten plug 54a and a remaining glue/barrier layer 53a are formed in the opening 52a. A tungsten spacer 54b a remaining glue/barrier layer 53b are formed on the sidewall of the opening 52b.

Figure 2F:
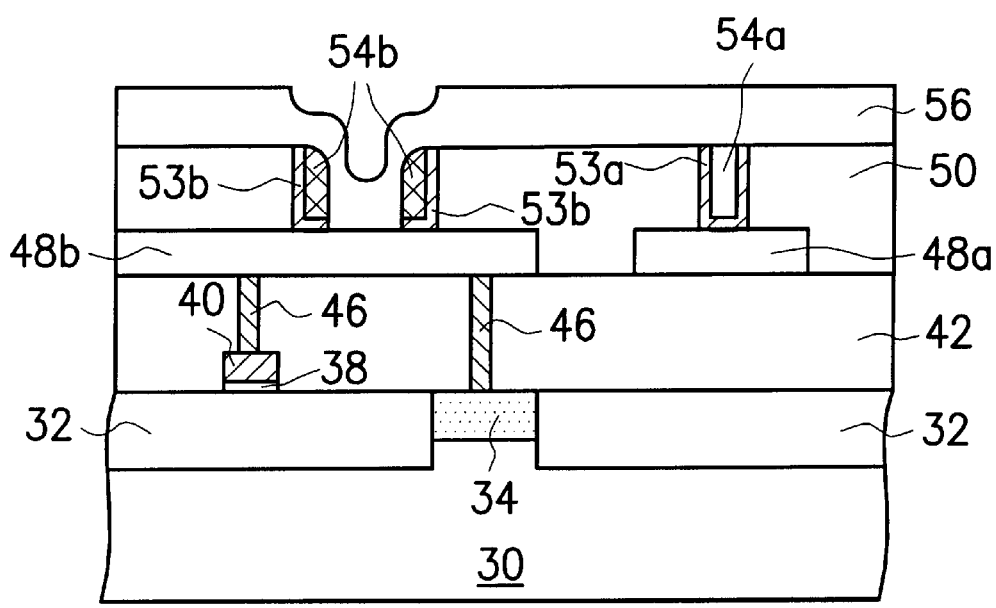

In FIG. 2F, a conductive layer 56, such as a metallic layer, is formed over the substrate 30 by, for example, chemical vapor deposition.

Figure 2G:
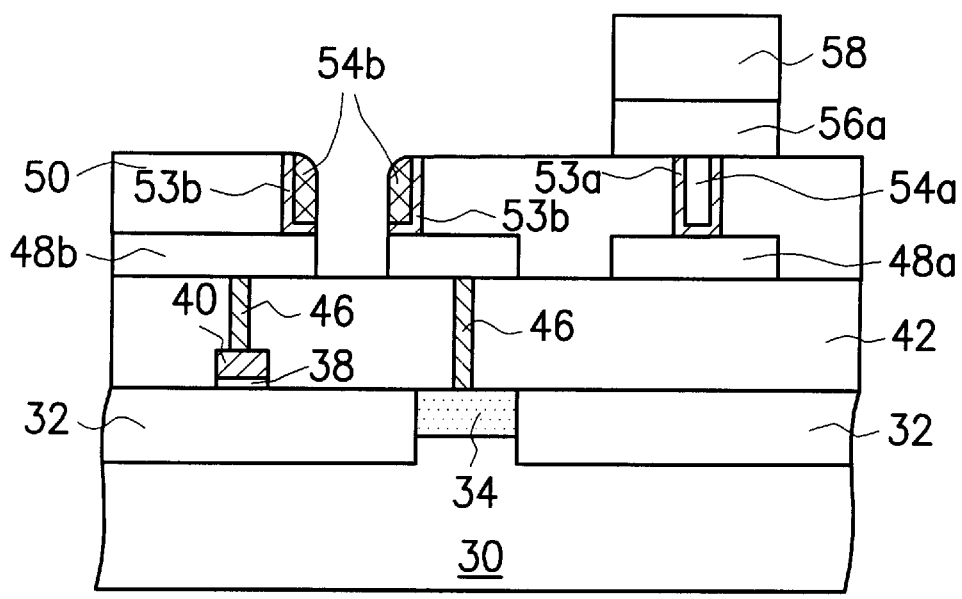

In FIG. 2G, a photoresist layer 58 is formed on the conductive layer 56 (shown in FIG. 2F) above the tungsten plug 54a. An etching step is performed with the photoresist layer 58 and the spacer 54b serving as masks. The conductive layers 56 and 48b exposed by the photoresist layer 58 and the spacer 54b are removed. A conductive layer 56a is formed. In the etching step, a portion of the conductive layer 48b is removed. The path described in FIG. 2C for releasing the electrons is cut and thus the circuit can be operated normally.

Figure 2H:
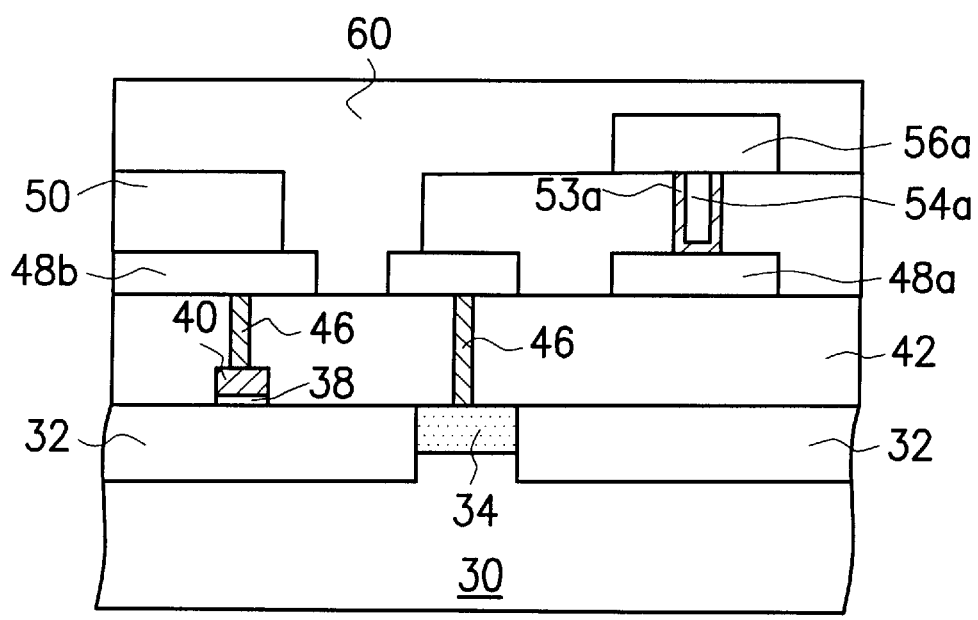
Figure 3C:
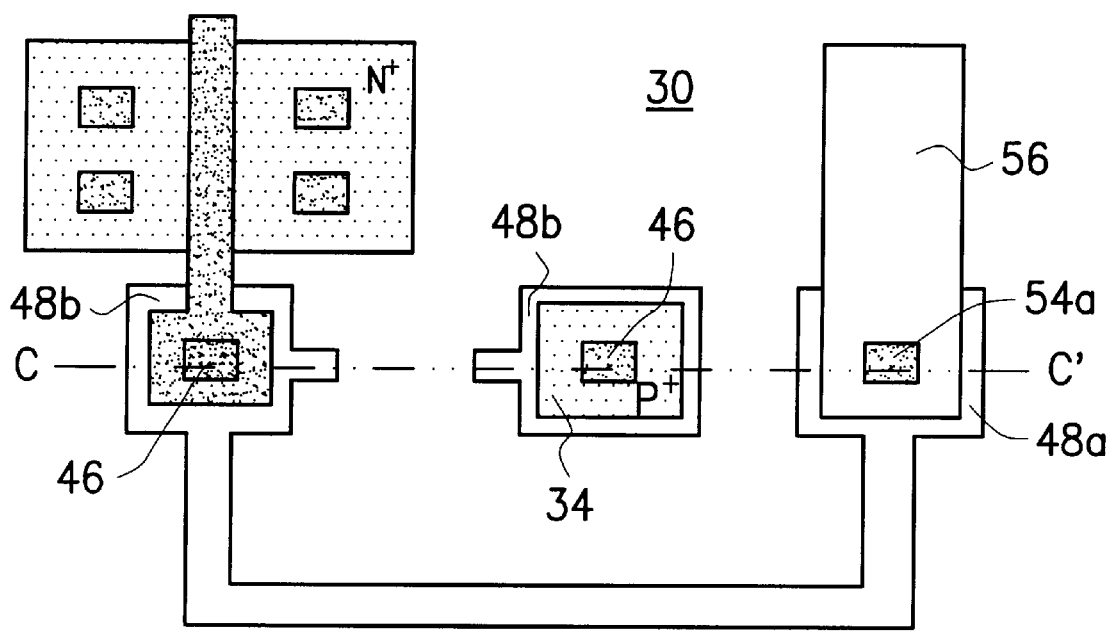

Reference is made to FIG. 2H, which is a schematic, cross-sectional view of FIG. 3C taken along line C-C'. FIG. 3C is a schematic, top view of the structure depicted in FIG. 2H. In FIG. 2H, the photoresist layer 58 is removed. The spacer 54b on the sidewall of the opening 52b is removed. A dielectric layer 60 is formed over the substrate 30.

In the invention, no additional mask layer or specific process is performed. Thus, the fabrication cost does not increase. In addition, the extra electrons are released through the path during the plasma-etching step. An antenna effect thus does not occur. The reliability of the semiconductor device is increased.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a semiconductor device for preventing an antenna effect, comprising the steps of:

forming an isolation structure in a semiconductor substrate to define an active region next to the isolation structure;

forming a gate comprising a polysilicon layer on the isolation structure;

forming a dielectric layer over the substrate;

patterning the dielectric layer to form a first opening and a second opening, wherein the first opening exposes a portion of the substrate in the active region and the second opening exposes a portion of the polysilicon layer of the gate;

forming a conductive layer on the dielectric layer to fill the first opening and the second opening;

removing a portion of the conductive layer until the surface of the conductive layer is level with the surface of the dielectric layer;

forming a patterned metallic layer that exposes a portion of the dielectric layer, wherein the metallic layer comprises a first metallic layer and a second metallic layer, the first metallic layer covers a portion of the dielectric layer, and the second metallic layer covers the conductive layer and a portion of the dielectric layer;

forming a dielectric layer over the substrate;

patterning the dielectric layer to form a first opening and a second opening, wherein the first opening exposes a portion of the first metallic layer, and the second opening exposes a portion of the second metallic layer;

forming a glue/barrier layer and a tungsten layer over the substrate;

removing portions of the tungsten layer and the glue/barrier layer to form a tungsten plug and a first remaining glue/barrier layer in the first opening, and a tungsten spacer and a second remaining glue/barrier layer on a sidewall of the second opening;

forming a third metallic layer over the substrate;

forming a patterned photoresist layer on the third metallic layer above the tungsten plug;

removing a portion of the third metallic layer and the second metallic layer with the photoresist layer and the tungsten spacer serving as masks; and removing the photoresist layer and the spacer.

2. The method of claim 1, wherein the isolation structure comprises a shallow trench isolation structure.

3. The method of claim 1, wherein the step of forming the dielectric layer comprises chemical vapor deposition.

4. The method of claim 1, wherein step of patterning the dielectric layer comprises a photolithographic and etching step.

5. The method of claim 1, wherein the material of the conductive layer comprises tungsten.

6. The method of claim 1, wherein the step of removing a portion of the conductive layer comprises etching back.

7. The method of claim 1, wherein the step of forming the glue/barrier layer comprises sputtering.

8. The method of claim 1, wherein the material of the glue/barrier layer comprises titanium/titanium nitride.

9. The method of claim 1, wherein the step of removing portions of the tungsten layer and the glue/barrier layer comprises etching.

10. The method of claim 1, wherein the step of forming the patterned metallic layer comprises plasma etching.

11. The method of claim 1, wherein the step of forming the third metallic layer comprises chemical vapor deposition.

* * * * *